United States Patent
Chung (10) Patent No.: US 7,256,502 B2
(45) Date of Patent: Aug. 14, 2007

(54) METAL INTERCONNECTIONS FOR SEMICONDUCTOR DEVICES INCLUDING A BUFFER LAYER ON A TRENCH SIDEWALL

(75) Inventor: Jin-Sung Chung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 60 days.

(21) Appl. No.: 10/901,877

(22) Filed: Jul. 29, 2004

(65) Prior Publication Data
US 2005/0003656 A1   Jan. 6, 2005

Related U.S. Application Data

(62) Division of application No. 10/644,462, filed on Aug. 20, 2003, now Pat. No. 6,787,448.

(30) Foreign Application Priority Data
Aug. 21, 2002   (KR) ............................ 2002-0049547

(51) Int. Cl.
*H01L 23/48* (2006.01)
(52) U.S. Cl. ...................... 257/774; 257/773; 257/751; 257/787; 257/760; 438/624; 438/627; 438/634; 438/637; 438/638; 438/639; 438/700
(58) Field of Classification Search ........ 257/758–760, 257/211, 773, 751, 787; 438/624, 627, 634, 438/637–700
See application file for complete search history.

(56) References Cited

U.S. PATENT DOCUMENTS

| | | | |
|---|---|---|---|
| 6,297,149 B1 | 10/2001 | Stamper | |
| 6,559,546 B1 * | 5/2003 | Achuthan et al. | ........... 257/758 |
| 6,686,662 B2 * | 2/2004 | Merchant et al. | ........... 257/751 |
| 2002/0177301 A1 | 11/2002 | Biolsi et al. | |

* cited by examiner

*Primary Examiner*—Zandra V. Smith
*Assistant Examiner*—Tsz Chiu
(74) *Attorney, Agent, or Firm*—Myers Bigel Sibley & Sajovec, PA

(57) ABSTRACT

A metal interconnection for an integrated circuit device is fabricated by forming a trench in an integrated circuit substrate and a via hole beneath a portion of the trench. The trench includes a trench sidewall and the via hole includes a sacrificial film therein. A buffer layer is formed on the trench sidewall. At least some of the sacrificial film is removed from the via hole by etching the sacrificial film through the trench that includes the buffer layer on the trench sidewall. The metal interconnection is formed in the via hole from which at least some of the sacrificial film has been removed, and in the trench. The buffer layer may use material having etch selectivity to an etchant which is used when removing the sacrificial film, to thereby protect the trench sidewall when removing the sacrificial film.

6 Claims, 10 Drawing Sheets

METAL INTERCONNECTIONS FOR SEMICONDUCTOR DEVICES INCLUDING A BUFFER LAYER ON A TRENCH SIDEWALL

RELATED APPLICATION

This application is a divisional of application Ser. No. 10/644,462, filed Aug. 20, 2003, now U.S. Pat No. 6,787, 448 entitled Methods for Forming Metal Interconnections for Semiconductor Devices Using a Buffer Layer on a Trench Sidewall, and claims the benefit of Korean Patent Application No. 2002-0049547, filed Aug. 21, 2002, the disclosure of which is hereby incorporated herein by reference in its entirety as if set forth fully herein.

FIELD OF THE INVENTION

The present invention relates to integrated circuit devices and manufacturing methods therefor, and more particularly to methods for forming metal interconnections for integrated circuit devices and devices so formed.

BACKGROUND OF THE INVENTION

As the integration density of integrated circuit devices continues to increase, the interconnection of active and/or passive devices in the integrated circuit may increasingly impact the device performance. Metal interconnection processes and structures using a metal layer of a low resistance such as copper have been developed to increase performance of the interconnections.

In particular, a "dual damascene" process that forms a via hole in a dielectric layer, forms a trench over the via hole, and forms a copper and/or other metal interconnection in the via hole and the trench, is widely used as an interconnection formation method. In order to reduce or prevent a damage of a bottom metal interconnection in dual damascene processes, it may be desirable to provide a high etch selectivity to a diffusion barrier layer or a stop layer formed on the bottom of the via hole during the trench etching.

When the dual damascene process is performed by using an interlayer dielectric layer of low dielectric constant, such as doped oxides, an etch selectivity of an etch stop layer exposed by the via hole during the trench etching may be reduced. It therefore may be difficult to stop the etching due to the reduced etching selectivity during the trench etching. As a result, the bottom metal interconnection may be damaged.

To reduce or solve these problems, it has been proposed to protect a bottom metal interconnection by filling the via hole with a sacrificial filling material (SFM), for example a flowable oxide (FOX) such as a hydrogen silsesquioxane HSQ, or a bottom anti-reflection coating (BARC). The trench etching then is performed.

FIGS. 1A to 1F are schematic cross-sectional views of a device for explaining a method for forming a metal interconnection using a conventional dual damascene process.

Figure 1A:
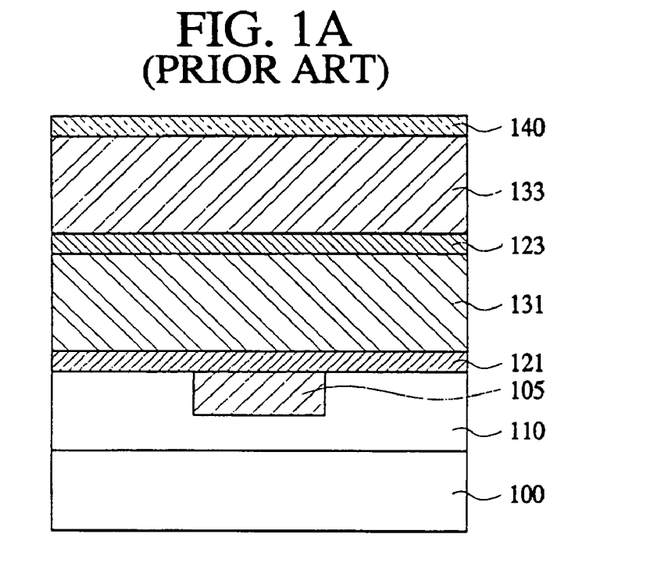
FIGS. 1A through 1G are schematic cross-sectional views of a conventional semiconductor device to explain a conventional method for forming a dual damascene metal interconnection.

Referring to FIG. 1A, an insulating layer 110, including a copper interconnection 105 as a bottom metal interconnection, is formed on a semiconductor substrate 100. Then, a first etch stop layer 121, a first interlayer insulation layer 131 of a low dielectric constant, a second etch stop layer 123, and a second interlayer insulation layer 133 of a low dielectric constant are sequentially formed on the insulating layer 110.

Thereafter, an insulating layer 140 acting as a buffer layer in a chemical-mechanical polishing (CMP) process, for example a plasma oxide layer (PEOX), is formed on the second interlayer insulation layer 133. Before the polishing buffer insulating layer 140 is deposited on the second interlayer insulation layer 133, a plasma treatment process using $N_2$ gas and/or the like may be performed to improve adhesion at an interface between the second interlayer insulation layer 133 and the polishing buffer insulating layer 140.

Figure 1B:
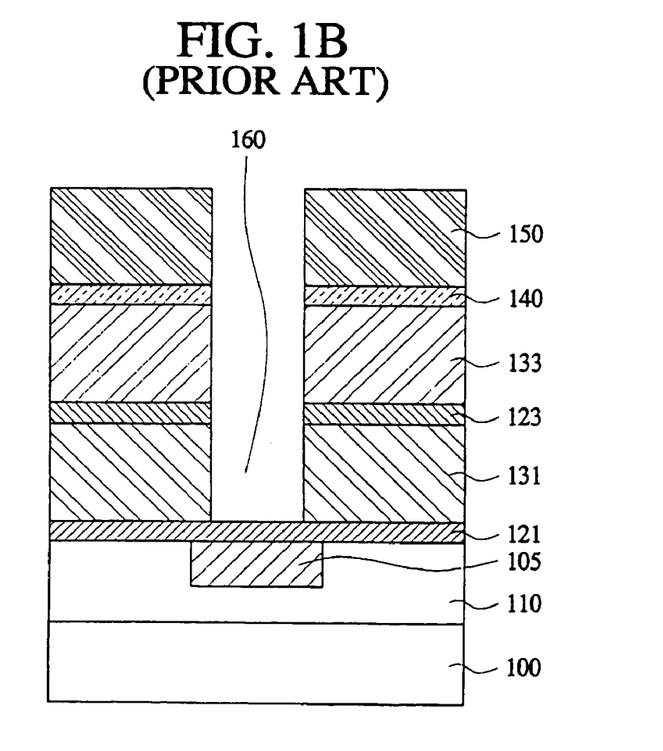

Referring to FIG. 1B, a first photoresist pattern 150 for a via hole is formed on the polishing buffer layer 140. The polishing buffer layer 140, the first and second interlayer insulation layers 131 and 133, and the second etch stop layer 123 are etched, using the first photoresist pattern 150 as an etch mask to form a via hole 160.

Figure 1C:
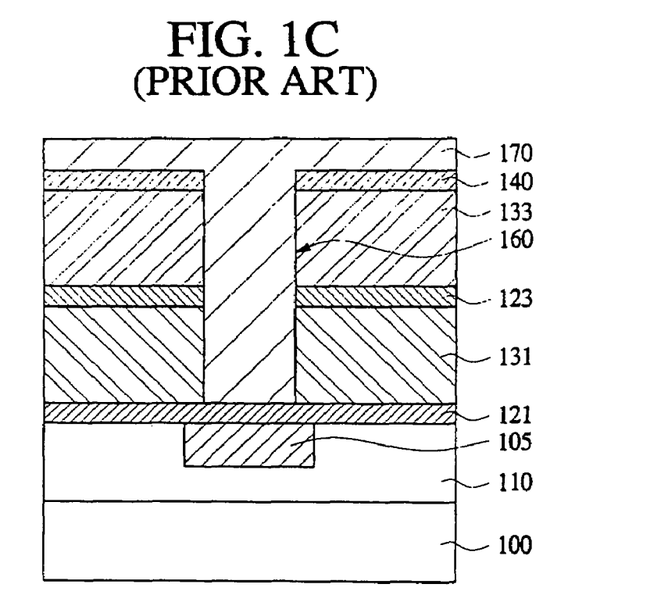

Referring to FIG. 1C, the first photoresist pattern 150 is removed. A sacrificial filling film 170 is formed on the polishing buffer layer 140 to fill the via hole 160. The sacrificial filling film 170 filled in the via hole 160 acts as a protective layer for protecting the bottom metal interconnection 105 during the subsequent trench etching process, and may comprise a flowable oxide such as HSQ.

Figure 1D:
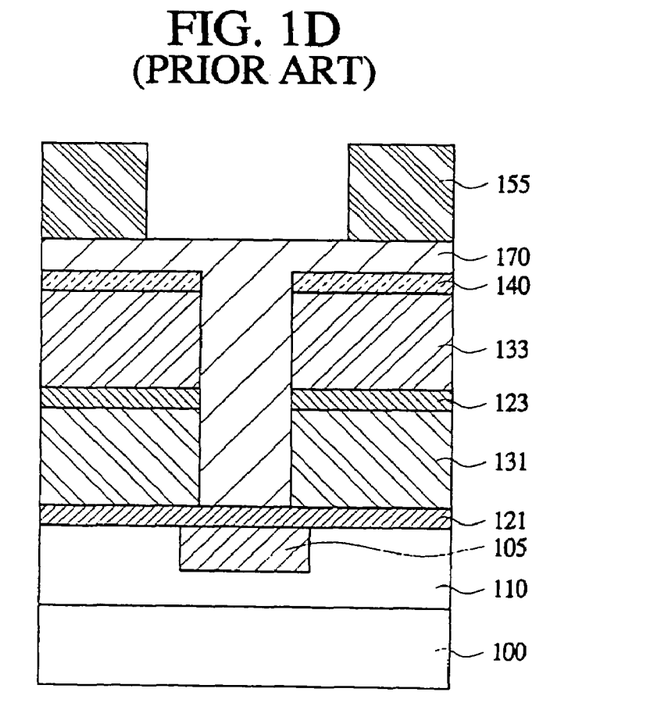

Referring to FIG. 1D, a second photoresist pattern 155 for a trench is formed on the sacrificial filling film 170 to expose a portion of the sacrificial filling film 170 including the via hole 160 where a trench is to be formed in the subsequent process.

Figure 1E:
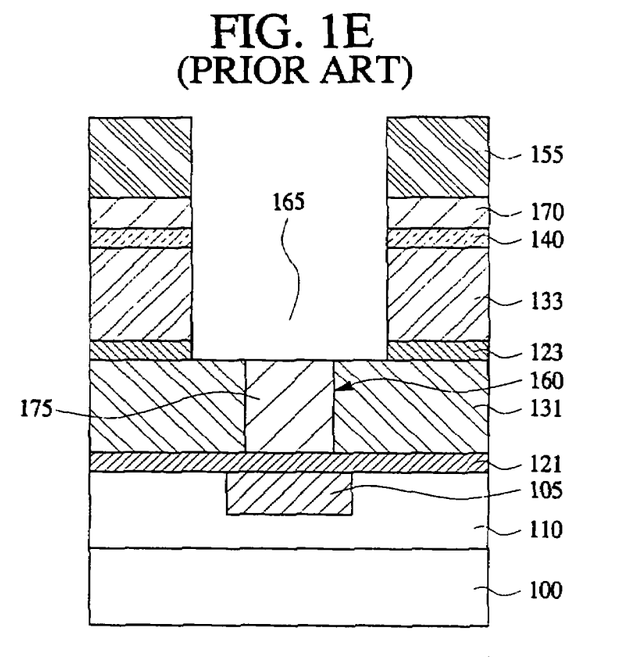

Referring to FIG. 1E, the sacrificial filling film 170, the polishing buffer layer 140, the second interlayer insulation film 133, and the second etch stop layer 123 are etched with the second photoresist pattern 155 as an etch mask to form a trench 165. At this time, a portion of the sacrificial filling film 175 remains within the via hole 160.

Figure 1F:
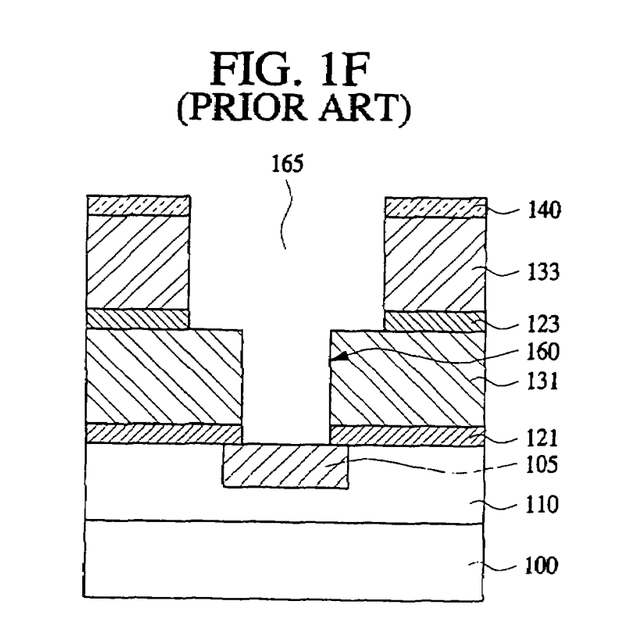

Referring to FIG. 1F, the second photoresist pattern 155 is removed. Then, the remaining sacrificial filling films 170 and 175 are removed by a wet etching process using HF. Thereafter, the first etch stop layer 121 within the via hole 160 is removed, thereby obtaining a dual damascene pattern including the via hole 160 and the trench 165.

Figure 1G:
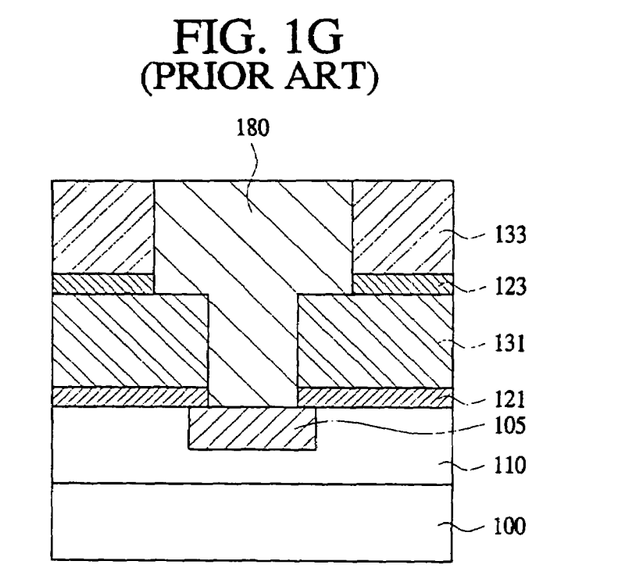

Referring to FIG. 1G, a metal film such as a copper film is deposited to fill the dual damascene pattern including the via hole 160 and the trench 165. The metal film is etched through the chemical mechanical polishing (CMP) process using the polishing buffer layer 140 to form a dual damascene metal interconnection 180.

Figure 2:
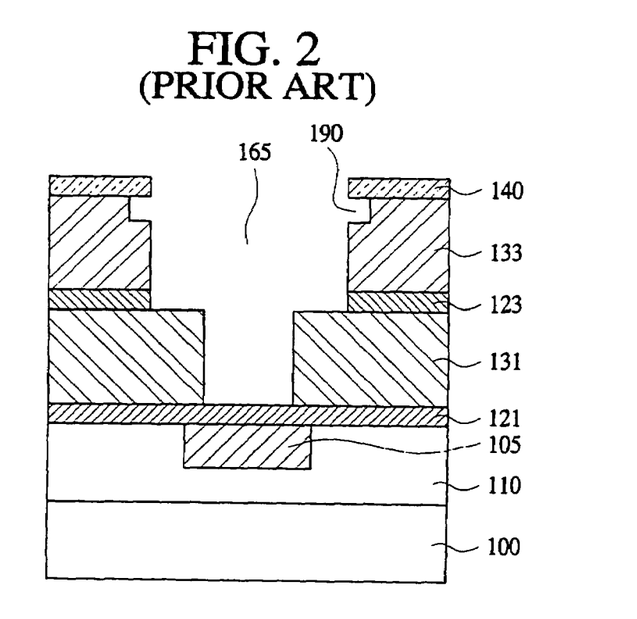
FIG. 2 is a schematic cross-sectional view of a conventional semiconductor device to explain a pattern failure in the conventional dual damascene metal interconnection.

A conventional method for forming dual damascene metal interconnection as described above, fills the sacrificial filling film 170 in the via hole 160 and then etches the second interlayer insulation layer 133 of a low dielectric constant to form the trench 165, thereby protecting the bottom metal interconnection 105 by the sacrificial filling film 170. However, a surface of the second interlayer insulation layer 133 may be damaged during the plasma treatment process that may be used to improve the adhesion between the second interlayer insulation film 133 and the polishing buffer layer 140. Thus, after forming the trench 165, when the remaining sacrificial filling films 170 and 175 are removed, the sacrificial filling films 170 and 175 as well as a damaged portion of the second interlayer insulation layer 133 may be removed. This removal may cause a necking phenomenon 190 or other flaw at the interface between the polishing buffer layer 140 and the second interlayer insulation layer 133, as shown in FIG. 2.

An adhesion fail of the polishing buffer layer 140 may be caused by the neck 190 or other flaw at the interface between the second interlayer insulation layer 133 and the polishing buffer layer 140. Therefore, the polishing buffer layer 140 may be lifted during the CMP process for forming the dual damascene metal interconnection. The desired dual damascene metal interconnection 180 therefore may not be formed properly.

SUMMARY OF THE INVENTION

Some embodiments of the present invention form a metal interconnection for an integrated circuit device by forming a trench in an integrated circuit substrate and a via hole beneath a portion of the trench. The trench includes a trench sidewall and the via hole includes a sacrificial film therein. A buffer layer is formed on the trench sidewall. At least some of the sacrificial film is removed from the via hole by etching the sacrificial film through the trench that includes the buffer layer on the trench sidewall. The metal interconnection is formed in the via hole from which at least some of the sacrificial film has been removed, and in the trench. In some embodiments, the buffer layer comprises material having etch selectivity to an etchant which is used when removing the sacrificial film, to thereby protect the trench sidewall when removing the sacrificial film. In some embodiments, necking or other flaws may thereby be reduced or prevented.

In some embodiments, the buffer layer comprises a conductive buffer layer, and is retained after the sacrificial film is removed from the via. In other embodiments, the buffer layer may be removed from the trench sidewall after the sacrificial film is removed from the via hole.

In other embodiments, a dual damascene metal interconnection is formed by forming an interlayer insulation layer and a polishing buffer layer on a semiconductor substrate. The interlayer insulation layer and the polishing buffer layer are etched to form a via hole. A sacrificial filling film is formed on the polishing buffer layer to fill the via hole. The sacrificial filling film, the polishing buffer layer and the interlayer insulation layer are etched to form a trench, thereby forming a dual damascene pattern including the via hole and the trench. An etching buffer layer is formed on a sidewall of the trench. At least some of the sacrificial filling film in the via hole is removed. Finally, a metal interconnection is formed within the dual damascene pattern.

In still other embodiments, a dual damascene metal interconnection is formed by sequentially forming a first etch stop layer, a first interlayer insulation layer, a second etch stop layer, a second interlayer insulation layer, and a polishing buffer layer on a semiconductor substrate. The first and second interlayer insulation layers, the second etch stop layer and the polishing buffer layer are etched to form a via hole. A sacrificial filling film is formed on the polishing buffer layer to fill the via hole. The sacrificial filling film, the polishing buffer layer, the second interlayer insulation layer and the second etch stop layer are etched to form a trench, thereby forming a dual damascene pattern including the via hole and the trench. An etching buffer layer is formed on the sidewall of the trench. The remaining sacrificial filling film is removed and then the first etch stop layer within the via hole is removed. A metal interconnection is then formed within the dual damascene pattern.

In some embodiments, the sacrificial filling film comprises a flowable oxide. In some embodiments, the etching buffer layer is comprised of a material having an etching selectivity to the sacrificial filling film and includes a barrier metal layer such as TiN and Ta or an insulating layer such as a nitride film. In some embodiments, the metal interconnection includes a first barrier metal film for the etching buffer layer formed on the sidewall of the trench, a second barrier metal film formed within the dual damascene pattern and a metal film that fills the dual damascene pattern. In other embodiments, the metal interconnection includes a barrier metal film formed within the dual damascene pattern, and a metal film that fills the dual damascene pattern.

Integrated circuits according to some embodiments of the present invention, comprise an integrated circuit substrate including a trench therein, and a via hole beneath a portion of the trench. The trench includes a trench sidewall. It will be understood that the integrated circuit substrate includes a semiconductor substrate and/or a semiconductor layer therein and also generally includes one or more conductive and/or insulating layers on the semiconductor substrate and/or semiconductor layer. The via hole and trench may be formed within one or more insulating layers on a semiconductor substrate and/or semiconductor layer. The via hole may be formed prior to the trench, or the trench may be formed prior to the via hole. A sacrificial film is included in the via hole, and a buffer layer is included on the trench sidewall. In some embodiments, the buffer layer comprises material having etch selectivity to an etchant of the sacrificial film. In some embodiments, the buffer layer comprises a conductive buffer layer.

Integrated circuits according to other embodiments of the present invention include a conductive buffer layer on the trench sidewall that does not extend into the via hole, and a metal interconnection in the via hole and in the trench. In some embodiments, the metal interconnection comprises a first metal film that extends conformally on the conductive buffer layer and in the via hole, and a second metal film on the first metal film that fills the trench and the via hole.

In addition, a metal interconnection of a semiconductor device, according to some embodiments of the present invention includes, an interlayer insulation layer including a dual damascene pattern comprised of a via hole and a trench on a semiconductor substrate. A first barrier metal layer is provided on the sidewall of the trench. A second barrier metal layer is provided within the dual damascene pattern. A metal film fills the dual damascene pattern.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface of a conductive line, is referred to as "outer," it is closer to the outside of the integrated circuit than other parts of the element. Furthermore, relative terms such as "beneath" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements.

FIGS. 3A through 3J are schematic cross-sectional views of devices according to embodiments of the present invention, during intermediate faction steps for forming a metal interconnection according to embodiments of the present invention.

Figure 3A:
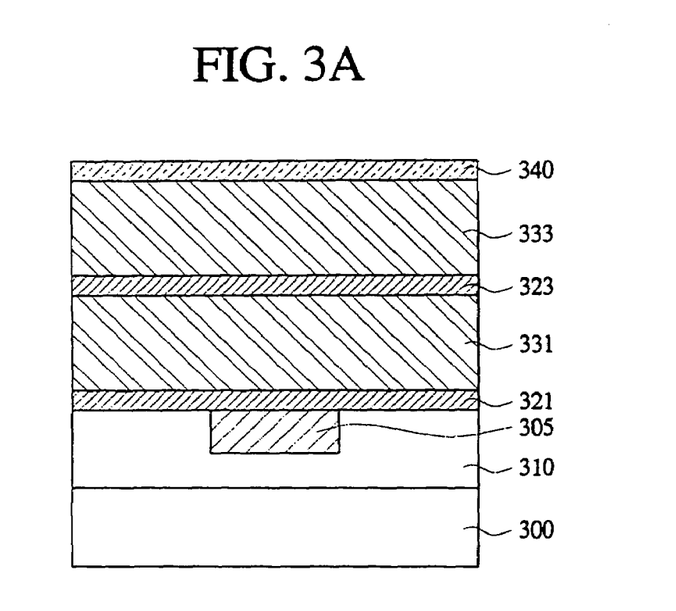
FIGS. 3A through 3J are schematic cross-sectional views of devices according to embodiments of the present invention, during intermediate faction steps for forming a metal interconnection according to embodiments of the present invention.

Referring to FIG. 3A, an insulating layer 310 including a bottom metal interconnection 305, such as a copper interconnection, is formed on a semiconductor substrate 300. As used herein, a semiconductor substrate includes a bulk semiconductor substrate and/or a semiconductor layer, which may be an epitaxial, semiconductor-on-insulator and/or other semiconductor layer. An integrated circuit substrate includes a semiconductor substrate and one or more patterned or unpatterned conductive and/or insulating layers on the semiconductor substrate.

As shown in FIG. 3A, a first etch stop layer 321, a first interlayer insulation layer 331 having a low dielectric constant, a second etch stop layer 323, and a second interlayer insulation layer 333 of a low dielectric constant are sequentially formed on the insulating layer 310 to appear as shown.

The first and second interlayer insulation layers 331 and 333 may comprise a doped oxide such as HSQ, methyl silsesquioxane MSQ, and SiOC. In some embodiments, the first and second etch stop layers 321 and 323 comprise a material having an etch selectivity relative to the first and second interlayer insulation layers 331 and 333, for example, a nitride film.

Thereafter, an insulating layer 340 acting as a buffer layer in a chemical-mechanical polishing (CMP) process, for example a plasma oxide layer (PEOX), is formed on the second interlayer insulation layer 333. After depositing the second interlayer insulation layer 333, a plasma treatment process using $N_2$ gas and/or the like is performed, to improve the adhesion in an interface between the second interlayer insulation layer 333 and the polishing buffer layer 340.

Figure 3B:
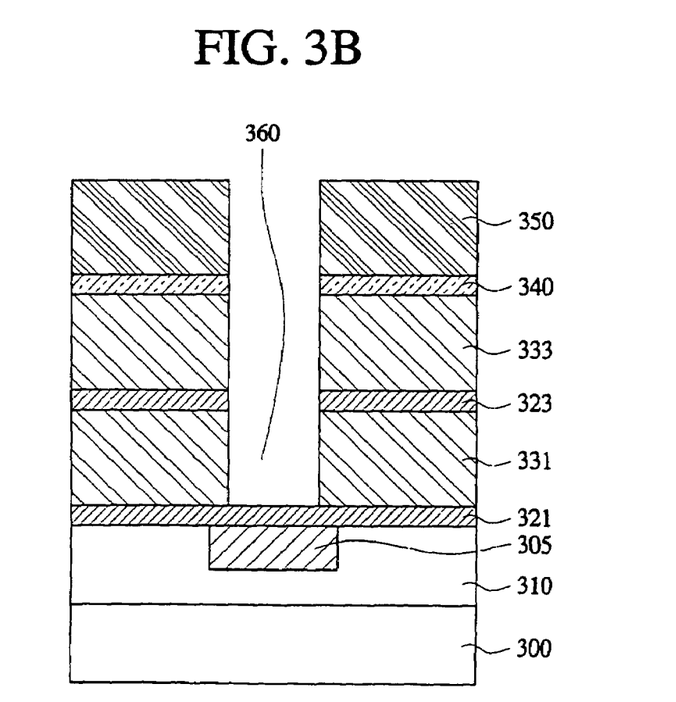

Referring to FIG. 3B, a first photoresist pattern 350 for a via hole is formed on the polishing buffer layer 340 to expose a portion of the polishing buffer layer 340 where a via hole is to be formed. The polishing buffer layer 340, the first and second interlayer insulation layers 331 and 333, and the second etch stop layer 323 are etched with the first photoresist pattern 350 as an etch mask to form a via hole 360.

Figure 3C:
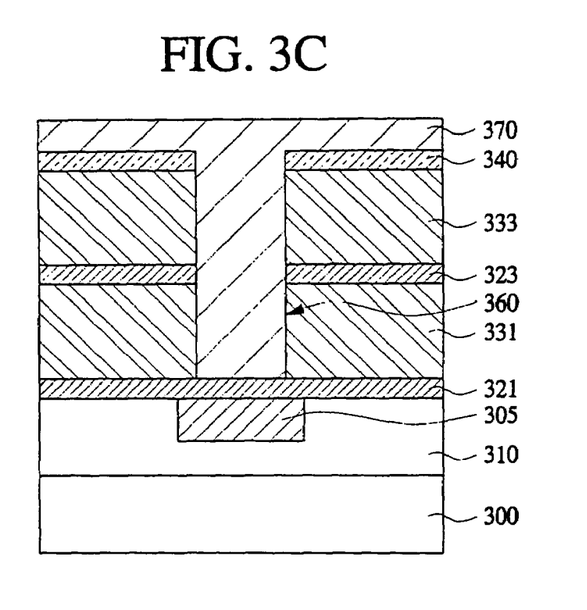

Referring to FIG. 3C, the first photoresist pattern 350 is removed. A sacrificial filling film 370, also referred to as a sacrificial film, is formed on the polishing buffer layer 340 to fill the via hole 360. The sacrificial filling film 370 acts as a protective film for protecting the bottom metal interconnection 305 in etching the second interlayer insulation layer 333 to form a trench in a subsequent process, and, in some embodiments, is comprised of a flowable oxide such as HSQ.

Figure 3D:
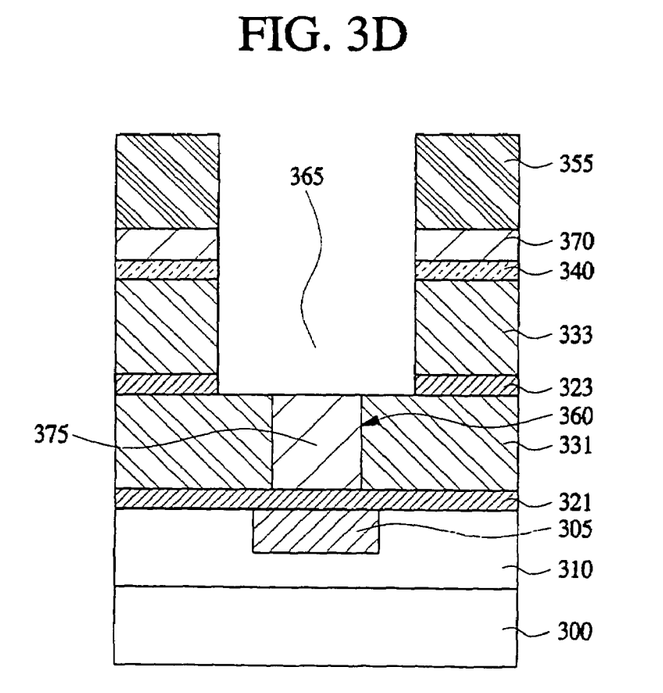

Referring to FIG. 3D, a second photoresist pattern 355 for a trench is formed on the sacrificial filling film 370 to expose a portion of the sacrificial filling film 370 where a trench is to be formed. Then, the sacrificial filling film 370, the polishing buffer layer 340, the second interlayer insulation layer 333, and the second etch stop layer 323 are etched with the second photoresist pattern 355 as an etch mask to form a trench 365.

Figure 3E:
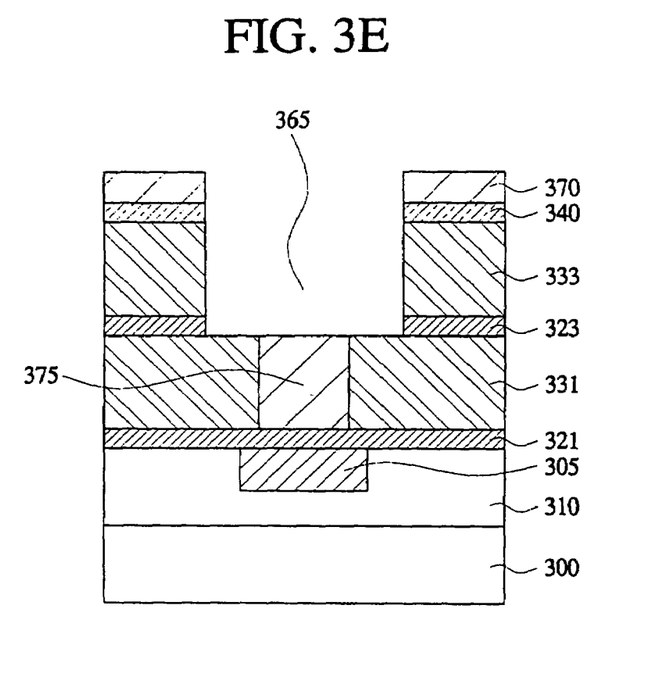

Referring to FIG. 3E, the second photoresist pattern 355 is removed. A portion 375 of the sacrifice filling film 370 acting as the protective film during the trench etching process remains within the via hole 360.

Accordingly, FIGS. 3A-3E illustrate methods of forming a metal interconnection for an integrated circuit device, according to some embodiments of the invention, by forming a trench 365 in an integrated circuit substrate, and a via hole 360 beneath a portion of the trench, wherein the trench includes a trench sidewall and the via hole includes a sacrificial film 375 therein. It will be understood that the via hole may be fabricated prior to, or after, the trench.

Figure 3F:
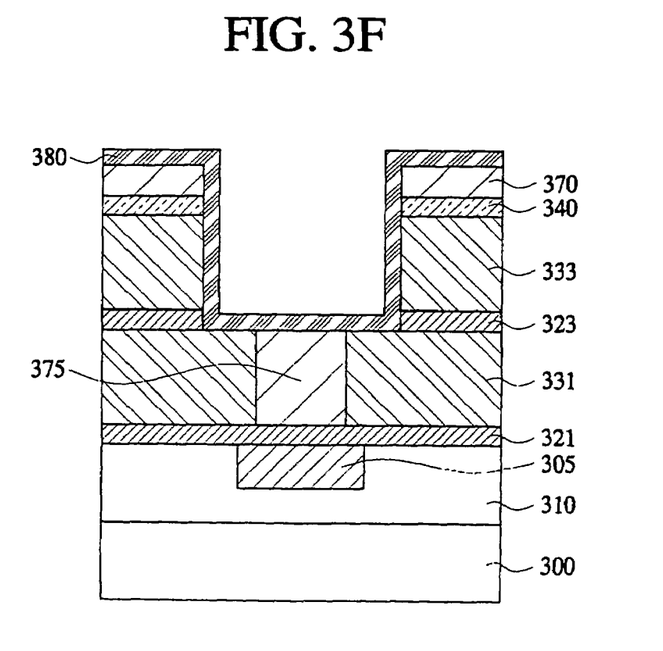

Referring to FIG. 3F, a film 380 having wet etching selectivity to the sacrificial filling film 370, is deposited on the substrate 300. In some embodiments, the film 380 is comprised of a barrier metal film such as a TiN film or a Ta film, or an insulation film such as a nitride film.

Figure 3G:
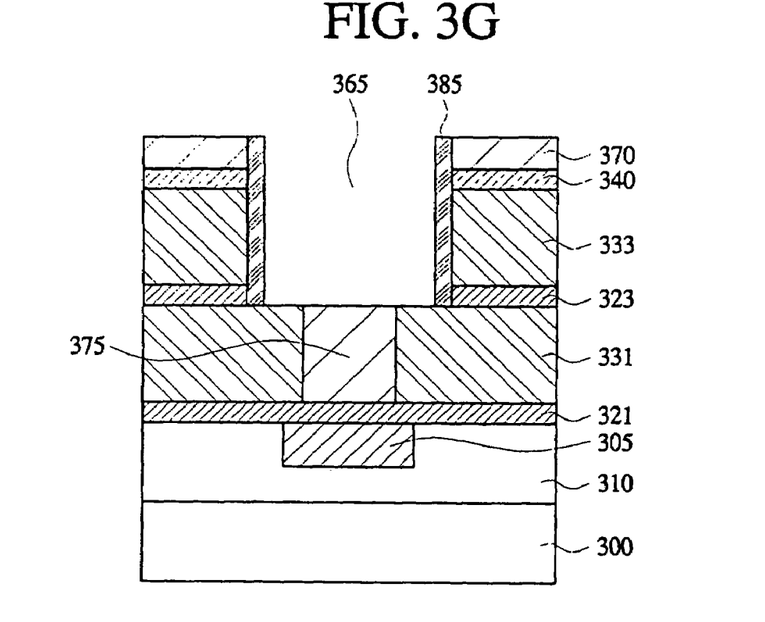

Referring to FIG. 3G, the film 380 is etched to form an etching buffer layer 385 of a spacer type, also referred to as a buffer layer, on the sidewall of the trench 365. The etching buffer layer 385 acts as a protective film of the second interlayer insulation layer 333 during removing the sacrificial filling film 370 in the subsequent process. Accordingly, FIG. 3G illustrates removing at least some of the sacrificial film from the via hole by etching the sacrificial film through the trench that includes the buffer layer on the trench sidewall.

Figure 3H:
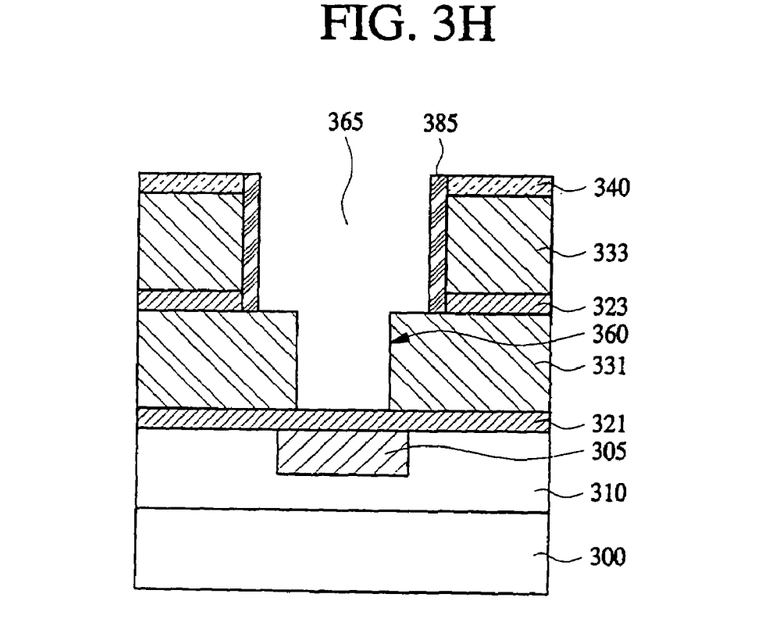

Referring to FIG. 3H, at least some of the sacrificial filling film, and in some embodiments the remaining sacrificial filling films 370 and 375, are removed by a wet etching process, for example using HF and the like. Since the second inter-insulation layer 333 and the polishing buffer layer 340 are protected by the etching buffer layer 385 formed on the sidewall of the trench 365, a flaw at the interface between the second inter-insulation layer 333 and the polishing buffer layer 340 may be reduced or prevented.

FIG. 3H also illustrates integrated circuits according to embodiments of the present invention, that comprise an integrated circuit substrate including a trench therein and a via hole beneath a portion of the trench. A sacrificial film is provided in the via hole, and a buffer layer is provided on the trench sidewall.

Figure 3I:
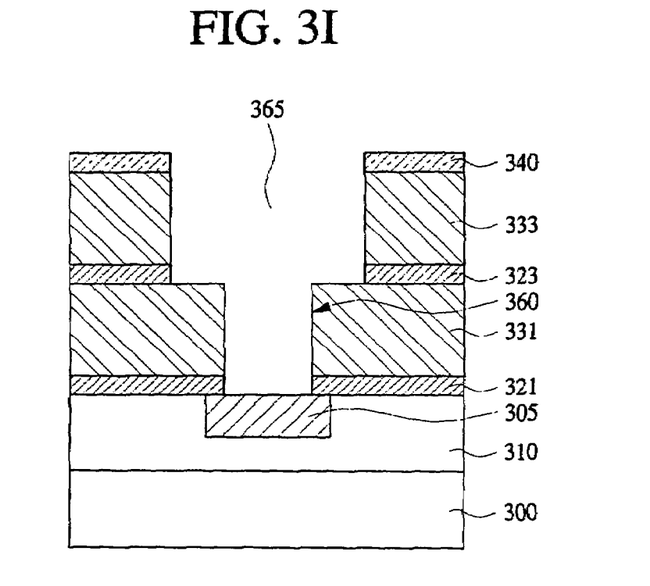
Figure 3J:
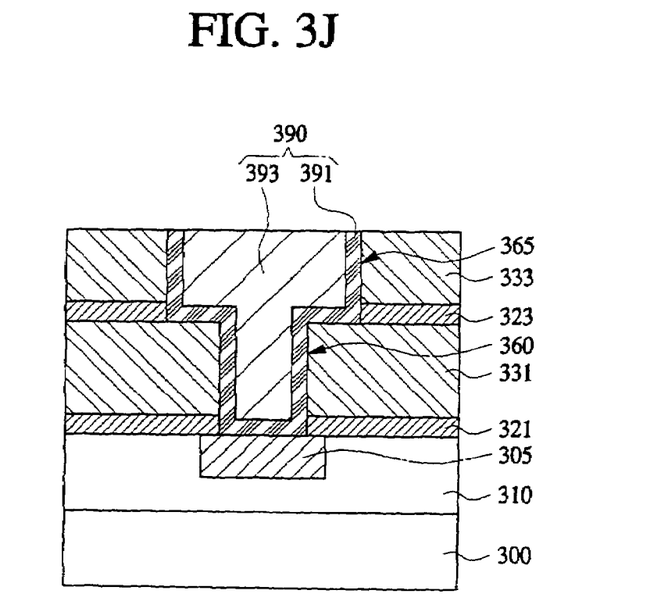

Referring to FIG. 3I, the first etch stop layer 321 within the via hole 360 and the etching buffer layer 385 is removed and a dual damascene pattern including the via hole 360 and the trench 365 is formed. Referring to FIG. 3J, a barrier metal layer 391 such as TaN is deposited on the substrate and then a metal layer 393 such as copper is deposited to fill the dual damascene pattern. The barrier metal layer 391 and the metal layer 393 are etched by performing the CMP process using the polishing buffer layer 340, to form a dual damascene metal interconnection 390.

Figure 4:
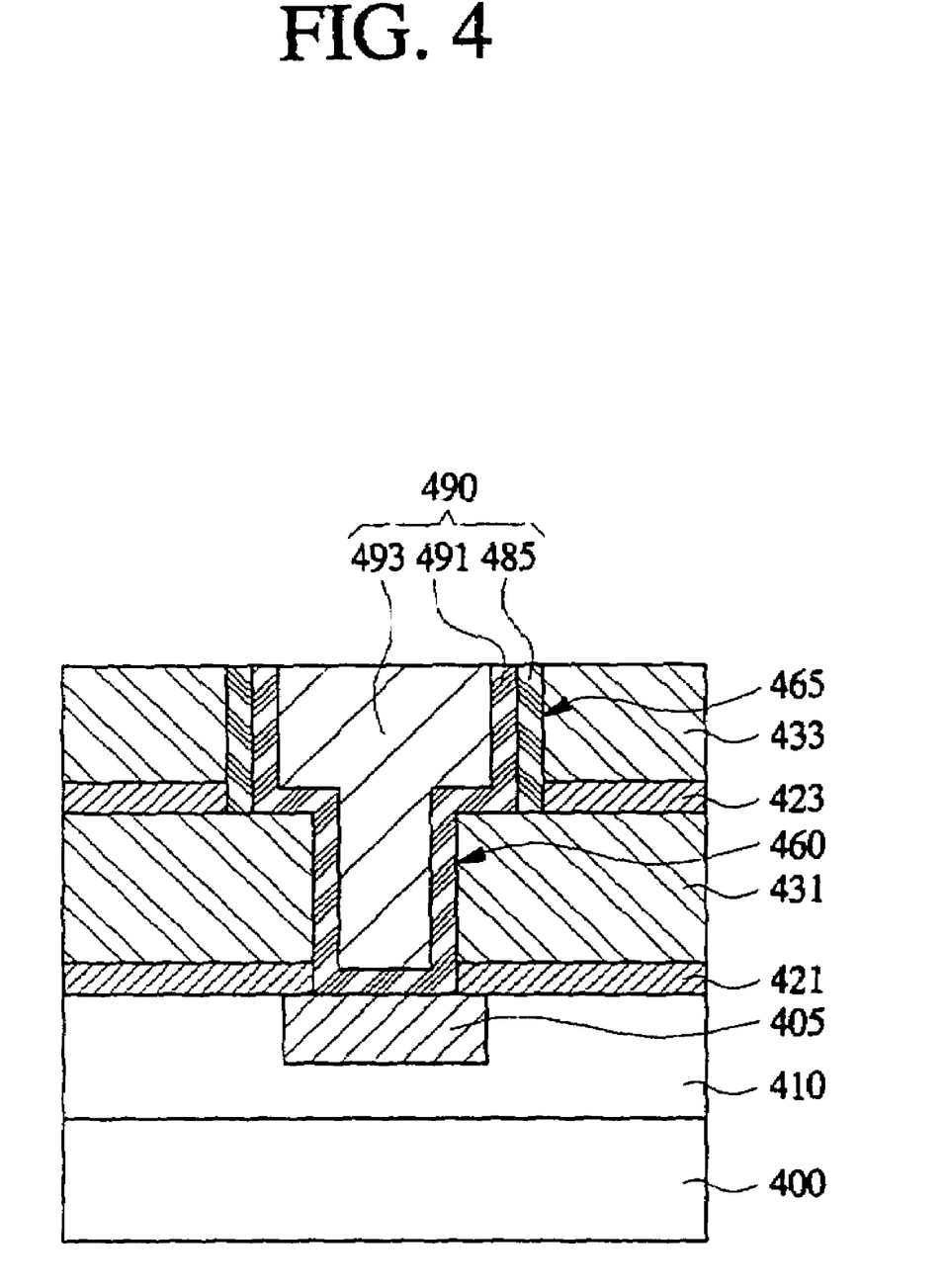
FIG. 4 is a schematic cross-sectional view of devices according to other embodiments of the present invention, as fabricated, according to other embodiments of the present invention.

FIG. 4 is a schematic cross-sectional view of a device according to other embodiments of the present invention, as fabricated, according to other embodiments of the present invention. These methods can form a dual barrier metal layer without removing the etching buffer layer.

In other words, similar to FIGS. 3A-3H, an insulation layer 410 including a bottom metal interconnection 405, such as a copper interconnection, is formed on a semiconductor substrate 400. A first etch stop layer 421, a first interlayer insulation layer 431 of a low dielectric constant, a second etch stop layer 423, a second interlayer insulation layer 433 of a low dielectric constant, and a polishing buffer layer (not shown) are sequentially deposited on the insulation layer 410. The polishing buffer layer, the first and second interlayer insulation layers 431 and 433, and the second etch stop layer 423 are etched to form a via hole 460. A sacrificial filling film (not shown) is deposited to fill the vial hole 160 and then the sacrificial filling film, the polishing buffer layer, the second interlayer insulation layer 433 and the second etch stop layer 423 are etched to form a trench 465.

Next, an etching buffer layer 485 is formed on the sidewall of the trench 465, and the remaining sacrificial filling film is removed. The first etch stop layer 421 within the via hole 460 is etched to expose the bottom metal interconnection 405, thereby forming a dual damascene pattern including the vial hole 460 and the trench 465. A barrier metal layer 491 such as TaN and a metal layer 493 such as copper are deposited on the substrate to fill the dual damascene pattern where the etch buffering layer 485 is formed on the sidewall of the trench 465. The metal layer 493 and the barrier metal layer 491 are etched through a CMP process using the polishing buffer layer to form a dual damascene metal interconnection 490 including a dual barrier metal layer of the barrier metal layer 491 and a barrier metal layer for the etching buffer layer 485, and the metal layer 493.

The dual damascene metal interconnection 490 according to these embodiments of the present invention uses the etching buffer layer 485 as a barrier metal film formed on the sidewall of the trench 465. This can reduce the contact resistance of the metal interconnection, improve the filling property of the metal interconnection and/or improve the diffusion barrier property of metal such as copper and like from the metal interconnection 490.

Accordingly, FIG. 4 illustrates integrated circuits according to other embodiments of the present invention that comprise an integrated circuit substrate including a trench therein and a via hole beneath a portion of the trench, the trench including a trench sidewall. A conductive buffer layer is provided on the trench sidewall that does not extend into the via hole. A metal interconnection is provided in the via hole and in the trench.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A dual damascene metal interconnection of a semiconductor device, comprising:
   a semiconductor substrate;
   an interlayer insulation layer including a dual damascene pattern comprising a trench and a via hole that is narrower than the trench beneath a portion of the trench on the semiconductor substrate such that the trench is over the via hole;
   a first barrier metal film in the trench on a sidewall of the trench that does not extend into the via hole;
   a second barrier metal film within the dual damascene pattern; and
   a metal film that fills the dual damascene pattern.

2. An integrated circuit comprising:
   an integrated circuit substrate including a trench therein and a via hole that is narrower than the trench beneath a portion of the trench such that the trench is over the via hole, the trench including a trench sidewall;
   a sacrificial film in the via hole; and
   a buffer layer extending along the trench sidewall toward the substrate.

3. An integrated circuit according to claim 2 wherein the buffer layer comprises material having etch selectivity to an etchant of the sacrificial film.

4. An integrated circuit according to claim 2 wherein the buffer layer comprises a conductive buffer layer.

5. An integrated circuit comprising:
   an integrated circuit substrate including a trench therein and a via hole that is narrower than the trench beneath a portion of the trench such that the trench is over the via hole, the trench including a trench sidewall;
   a conductive buffer layer in the trench on the trench sidewall that does not extend into the via hole; and
   a metal interconnection in the via hole and in the trench.

6. An integrated circuit according to claim 5 wherein the metal interconnection comprises:
   a first metal film that extends conformally on the conductive buffer layer and in the via hole; and
   a second metal film on the first metal film that fills the trench and the via hole.

* * * * *